US006933485B2

United States Patent
Livermore et al.

(10) Patent No.: US 6,933,485 B2
(45) Date of Patent: Aug. 23, 2005

(54) STABILIZING POWER AND WAVELENGTH OF OUTPUT RADIATION FROM A STABILIZED RADIATION SOURCE IN OPTICAL COMMUNICATIONS SYSTEMS

(75) Inventors: Peter J Livermore, Beeston (GB); Michael J Leach, Awsworth (GB); Graham Butler, Nottingham (GB); Darren Vass, Toton (GB)

(73) Assignee: Marconi Lik Intellectual Property Ltd., Coventry (GB)

( * ) Notice: Subject to any disclaimer, the term of this patent is extended or adjusted under 35 U.S.C. 154(b) by 218 days.

(21) Appl. No.: 10/239,616

(22) PCT Filed: Mar. 14, 2001

(86) PCT No.: PCT/GB01/01117

§ 371 (c)(1),
(2), (4) Date: Sep. 24, 2002

(87) PCT Pub. No.: WO01/73904

PCT Pub. Date: Oct. 4, 2001

(65) Prior Publication Data

US 2003/0047665 A1 Mar. 13, 2003

(30) Foreign Application Priority Data

Mar. 25, 2000 (GB) .............................................. 0007234

(51) Int. Cl.$^7$ ................................................. G01J 1/32
(52) U.S. Cl. ....................................... 250/205; 250/226
(58) Field of Search ................................. 250/205, 226, 250/216, 227.23; 372/32, 29; 359/260

(56) References Cited

U.S. PATENT DOCUMENTS

| 4,815,081 | A | | 3/1989 | Mahlein et al. |
| 4,821,273 | A | | 4/1989 | Hori |
| 5,299,212 | A | * | 3/1994 | Koch et al. ................... 372/32 |
| 5,706,126 | A | | 1/1998 | Fujita |
| 6,262,822 | B1 | * | 7/2001 | Obhi et al. ..................... 398/9 |

FOREIGN PATENT DOCUMENTS

| EP | 0 939 470 A2 | 9/1999 |
| EP | 0 967 698 A2 | 12/1999 |
| GB | 2 007 015 A | 5/1979 |
| WO | 97/05679 | 2/1997 |
| WO | 98/43327 | 10/1998 |

* cited by examiner

Primary Examiner—Que T. Le
(74) Attorney, Agent, or Firm—Kirschstein, et al.

(57) ABSTRACT

A stabilized radiation source includes a distributed feedback laser, a back lens for coupling a portion of the output radiation into first and second optical paths, optical detectors for detecting radiation transmitted through the first and second paths, and for generating first and second signals indicative of radiation power, and a control circuit for controlling the laser in response to the signals for stabilizing. The first and second radiation paths are operable to provide substantially unfiltered and wavelength dependent filtered radiation transmission therethrough respectively to the detectors. Unfiltered radiation transmitted through the first path which is converted into the first signal is especially suitable for implementing laser output radiation power stabilization which is output radiation wavelength independent.

10 Claims, 5 Drawing Sheets

STABILIZING POWER AND WAVELENGTH OF OUTPUT RADIATION FROM A STABILIZED RADIATION SOURCE IN OPTICAL COMMUNICATIONS SYSTEMS

The present invention relates to a stabilised radiation source. The invention also relates to a method of stabilising the power and wavelength of output radiation from a stabilised radiation source.

In conventional optical communication systems, communication traffic bearing optical radiation is partitioned into a number of discrete wavebands, each waveband being associated with a corresponding system communication channel. Radiation within each waveband conveys its associated portion of the communication traffic. Such distribution of communication traffic within the wavebands is known as wavelength division multiplexing (WDM).

In many communication systems, the channels occur at a mutual wavelength spacing of 0.8 nm where optical radiation has a nominal wavelength of approximately 1.5 $\mu$m; such a spacing is equivalent to a mutual channel frequency spacing of around 100 GHz. Although each channel has an associated potential bandwidth of 100 GHz, this bandwidth cannot be fully utilised in practice because of bandwidth limitations associated with electrical modulators used for modulating the optical radiation of each channel. Thus, in order to increase the communication capacity of communication systems, it is desirable to reduce the mutual channel spacing to less than 100 GHz. However, a reduction in mutual channel spacing places high demands on the stability of optical components employed in the communication systems for generating the radiation for each channel and for isolating the radiation when received for purposes of detecting traffic associated with specific channels.

In the communication systems, it is current practice to employ tunable lasers for generating radiation corresponding to their associated channels. As mutual channel spacings are reduced to below 100 GHz, frequency stability of such lasers becomes an important issue. Moreover, conventional communication systems often employ optical amplifiers at repeater nodes to amplify radiation propagating therethrough. Such optical amplifiers are inherently nonlinear devices, hence radiation supplied thereto must be within a limited radiation power range over which the amplifiers function optimally. Where such radiation comprises radiation components corresponding to a plurality of channels, the inventors have appreciated that it is desirable that the components are of nominally similar radiation power otherwise the optical amplifiers accentuate radiation components of certain channels relative to other channels. Thus, it is desirable to control the radiation power associated with radiation of each channel. Such control is conventionally achievable using a variable optical attenuator associated with each channel. However, the inventors have additionally appreciated that it is desirable that lasers feeding radiation to such attenuators can also be controlled with regard to their radiation power output.

It will be realised from the foregoing that there is need in future communication systems for laser radiation sources which are highly stable with regard to radiation output frequency and radiation output power.

It is known to apply negative feedback loops around lasers to increase their frequency stability. At least one commercial company presently manufactures a type of frequency stabilised laser source comprising a tunable DFB laser together with two associated mutually detuned optical filters with associated optical detectors and negative feedback control electronic circuits all housed within a single package. Correct frequency operation is achieved in the source when radiation transmitted through the optical filters is nominally of similar power, the correct frequency centred where passband characteristics of the filters mutually overlap. As a consequence of such a mode of operation, the inventors have appreciated that detected signals from the detectors cannot be used for output amplitude control purposes until the source has frequency stabilised by virtue of its frequency feedback loop. Thus, the source exhibits an intrinsic problem with regard to achieving both frequency and amplitude stabilisation, especially with regard to source initial start-up characteristics.

The inventors have addressed the aforementioned intrinsic problem by devising an alternative stabilised radiation source.

According to a first aspect of the present invention, there is provided a stabilised radiation source comprising:

(a) radiation generating means for generating output radiation;

(b) radiation coupling means for coupling a portion of the output radiation into first and second optical paths;

(c) detecting means for detecting radiation transmitted through the first and second paths, and for generating first and second signals indicative of radiation power in the radiation transmitted through the first and second paths respectively; and (d) controlling means for controlling the generating means in response to the signals for stabilising at least one of wavelength and power of the output radiation, characterised in that the first and second radiation paths are operable to provide substantially unfiltered and wavelength dependent filtered radiation transmission therethrough to the detecting means.

The invention provides the advantage that the source is capable of providing output radiation power control based on radiation transmitted along the first path, and output radiation wavelength control based on radiation transmitted along both paths.

Conveniently, the controlling means includes signal processing means for determining a ratio of the first and second signals, and the controlling means is operable to use the ratio for controlling the wavelength of the output radiation. Determining the ratio provides the benefit of a simple manner for implementing a negative feedback loop for stabilising output radiation wavelength. The controlling means is preferably operable to drive the generating means so that the signals are substantially equal in magnitude; such equality is straightforward to detect using conventional amplifiers or comparators, either implemented in analogue or digital form.

Beneficially, the controlling means is operable to use the first signal for controlling radiation power of the output radiation. Use of the first signal for output radiation power control provides a straightforward negative feedback loop.

In order to provide a wavelength dependent signal for wavelength stabilising purposes, it is preferable that the second path includes an optical filter etalon for providing wavelength dependent radiation filtration of radiation propagating along the second path. Such etalons can be easily customised to provide a range of wavelength dependent transmission characteristics. It is found particularly beneficial in practice for the etalon to provide radiation transmission therethrough which changes substantially linearly with radiation wavelength over a range of wavelengths in which the source is operable. This linear response avoids local minima in the response which can give rise to unpredictable initial stabilisation of the source.

Conveniently, especially with regard to output radiation power stabilisation, the first path is devoid of wavelength dependent filtration components. Such an absence of components means that the first signal is a direct indication of output radiation power irrespective of output radiation wavelength.

In practice, it is found advantageous that the controlling means is operable to modify the temperature of the generating means for controlling the wavelength of the output radiation. Thermal expansion of the generating means with increasing temperature has an effect of causing linear expansion of the generating means and hence an increase in the wavelength of the output radiation. Such thermal control is preferable because it is straightforward to implement.

Conveniently, the generating means includes a laser for generating the output radiation, and a thermoelectric element operable to cool or heat the laser for modifying the wavelength of the output radiation, the element being drivable from the controlling means.

In order to improve common mode rejection characteristics of the source with ambient temperature, the detecting means preferably includes a plurality of radiation detectors for generating the signals, the detectors having mutually matched detection characteristics.

In a second aspect of the present invention, there is provided a method of stabilising the power and wavelength of output radiation from a source according to the first aspect of the invention, the method including the steps of:

(a) applying power to the generating means for generating the output radiation;

(b) coupling a portion of said output radiation to the first and second paths;

(c) wavelength dependent filtering radiation propagating along the second path;

(d) propagating radiation substantially unfiltered along the first path;

(e) generating at the detecting means signals corresponding to radiation transmitted through the first and second paths; and (f) using the signals to control the generating means for stabilising the power and wavelength of the output radiation.

An embodiment of the invention will now be described, by way of example only, with reference to the following drawings in which.

Figure 1:
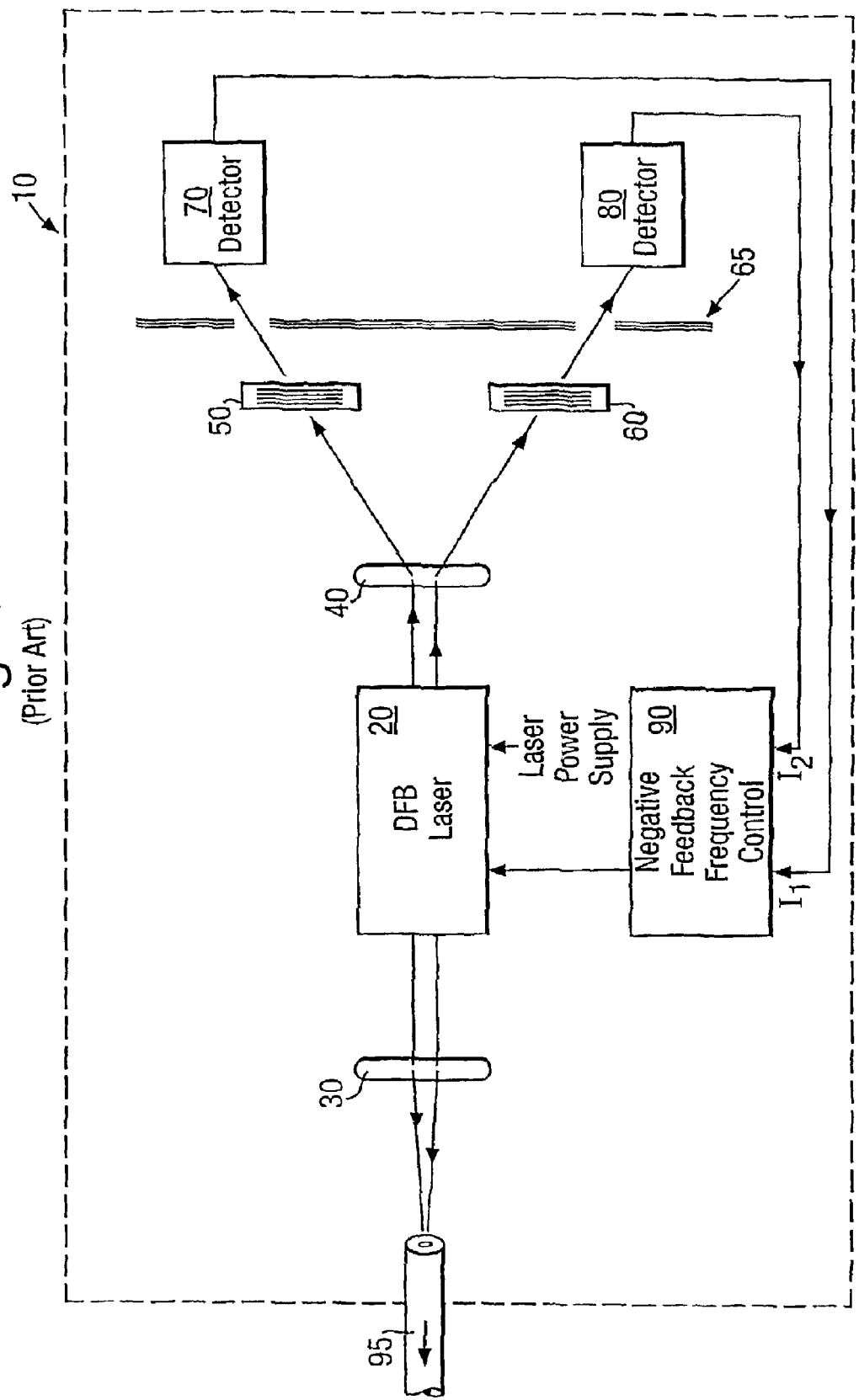
FIG. 1 is a schematic diagram of principal optical components of a prior art frequency stabilised laser source.

Referring now to FIG. 1, there is shown a prior art frequency stabilised laser source indicated generally by 10. The source 10 comprises a tunable DFB laser 20, a front facet lens 30, a rear facet lens 40, two mutually detuned optical filters 50, 60, a stencil mask 65, two matched optical detectors 70, 80, and a negative feedback frequency control circuit 90. The front lens 30 is located between an output port of the source 10 and a first end of the laser 20. The rear lens 40 is located between a second end of the laser 20 and the two filters 50, 60. The mask 65 is located more remotely from the laser 20 behind the filters 50, 60. Behind the mask 65 and yet further from the laser 20 are located the two detectors 70, 80.

When the source 10 is in operation, the lens 30 focuses optical radiation emitted in a forward direction from the laser 20 for reception, for example, at an end of an optical fibre waveguide 95 connected to the optical port. The rear lens 40 receives a relatively smaller proportion of radiation generated within the laser 20 compared to the front lens 30. The lens 40 diverts equal amounts of radiation towards each of the filters 50, 60. The filters 50, 60 filter radiation received thereat and transmit associated filtered radiation through apertures in the stencil mask 65 to the detectors 70, 80 respectively. The detectors 70, 80 convert filtered optical radiation received thereat into corresponding electrical signals $I_1$, $I_2$ respectively. The negative feedback circuit 90 is connected to the laser 20 and controls the operating frequency of the laser 20 so that the signals $I_1$, $I_2$ are similar in magnitude. When the signals $I_1$, $I_2$ are similar in magnitude, the laser 20 is stabilised in frequency.

As a consequence of the filters 50, 60 being of similar construction other than being mutually detuned, and the detectors 70, 80 being matched, the filters 50, 60 and the detectors 70, 80 nominally track with changes in temperature.

Frequency stability of the source 10 is determined primarily by the wavelength stability of optical transmission characteristics of the filters 50, 60, by temporal and thermal sensitivity matching of the detectors 70, 80 as well as control accuracy and stability of the feedback control circuit 90.

Figure 2:
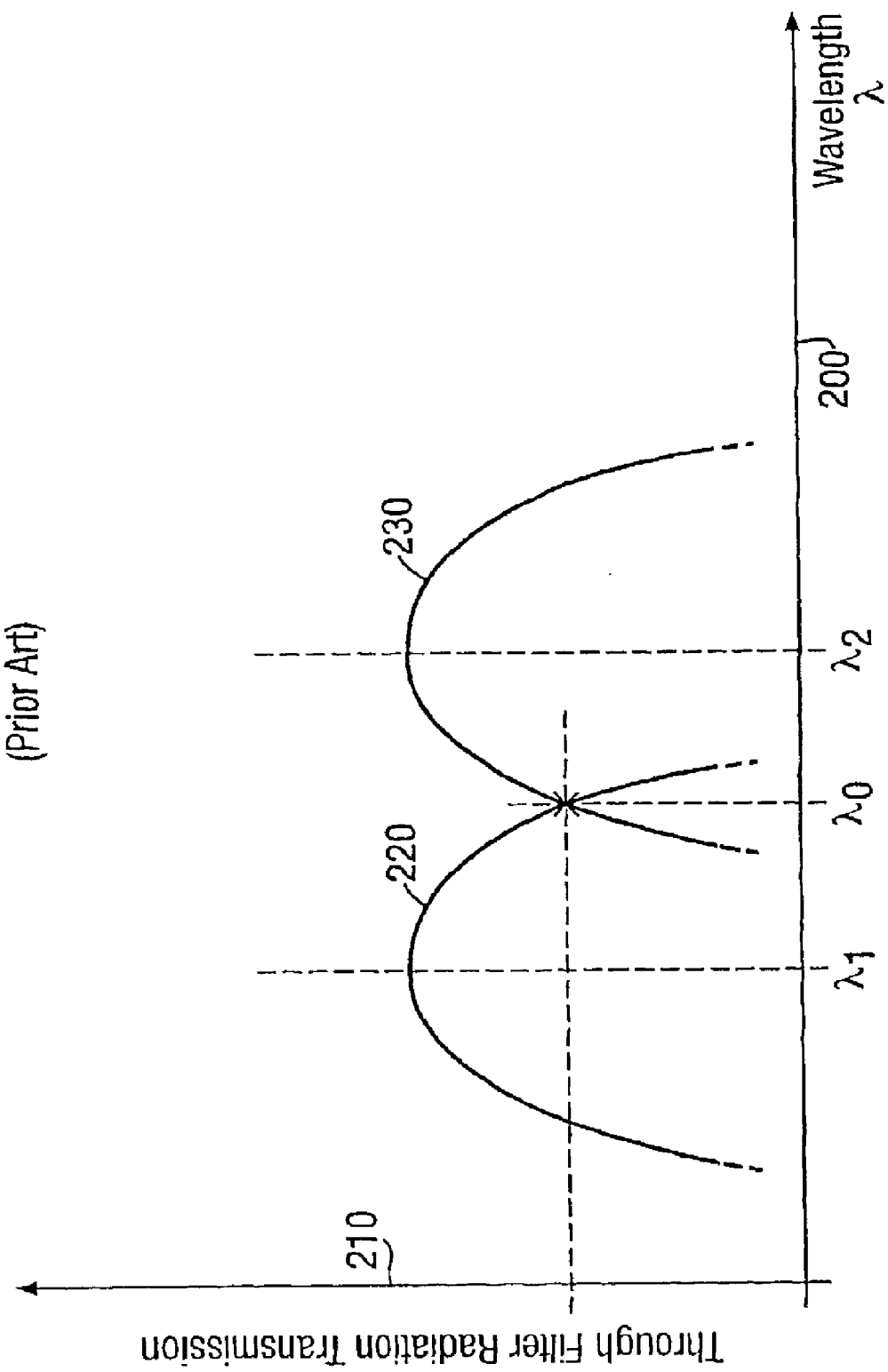
FIG. 2 is a graph illustrating transmission characteristics of optical filters included within the source illustrated in FIG. 1.

In order to describe further operation of the prior art source 10, there is shown in FIG. 2 a graph illustrating transmission characteristics of the filters 50, 60 included within the source 10. In the graph, radiation wavelength is represented along a horizontal axis 200 and radiation transmission through the filters 50, 60 along a vertical axis 210. Transmission characteristics of the filters are represented by Gaussian-like curves 220, 230 respectively. As described in the foregoing, both filters 50, 60 receive substantially similar radiation from the source 20. The curves 220, 230 are mutually detuned having peak resonances at frequencies of $\lambda_1, \lambda_2$ respectively. However, portions of the curves 220, 230 overlap and provide nominally similar transmission characteristics at a wavelength $\lambda_0$. When the laser 20 is tuned to output radiation at the wavelength $\lambda_0$, the filters 50, 60 nominally transmit similar amounts of radiation resulting in the signals $I_1$, $I_2$ being mutually similar. The feedback circuit 90 is designed to tune the laser 20 so that the signals $I_1$, $I_2$ are similar; such tuning ensures that the laser is outputting radiation at the wavelength $\lambda_0$.

It can be seen from FIG. 2 that at initial start-up, the laser 20 will in most instances be detuned away from the wavelength $\lambda_0$. As the laser 20 is driven during a tuning period towards its tuned wavelength $\lambda_0$, both of the signals $I_1$, $I_2$ will be varying until operation at the wavelength $\lambda_0$ is attained. Thus, during the tuning period, it is not feasible to use the signals $I_1$, $I_2$ for controlling radiation output power from the laser 20. If the laser 20 is considerably detuned, it is even feasible for the signals $I_1$, $I_2$ to nominally correspond to negligible radiation received at the detectors 50, 60. In communication systems, it is desirable for radiation output power from the laser 20 to be regulated during the tuning period in order to avoid overload occurring within the systems, for example in erbium-doped fibre amplifiers included therein.

The inventors have appreciated that in communication systems employing dense DWDM, for example with channel spacings of considerably less than 100 GHz, it is necessary to control the wavelength of laser sources incorporated therein to a relatively high degree of accuracy whilst maintaining optical output power from the sources at a predetermined level. The predetermined level in some circumstances will require in-service adjustment whilst wavelength stability of the sources is maintained. Thus, the inventors have devised an alternative radiation source which addresses aforementioned issues of wavelength and power control.

Figure 3:
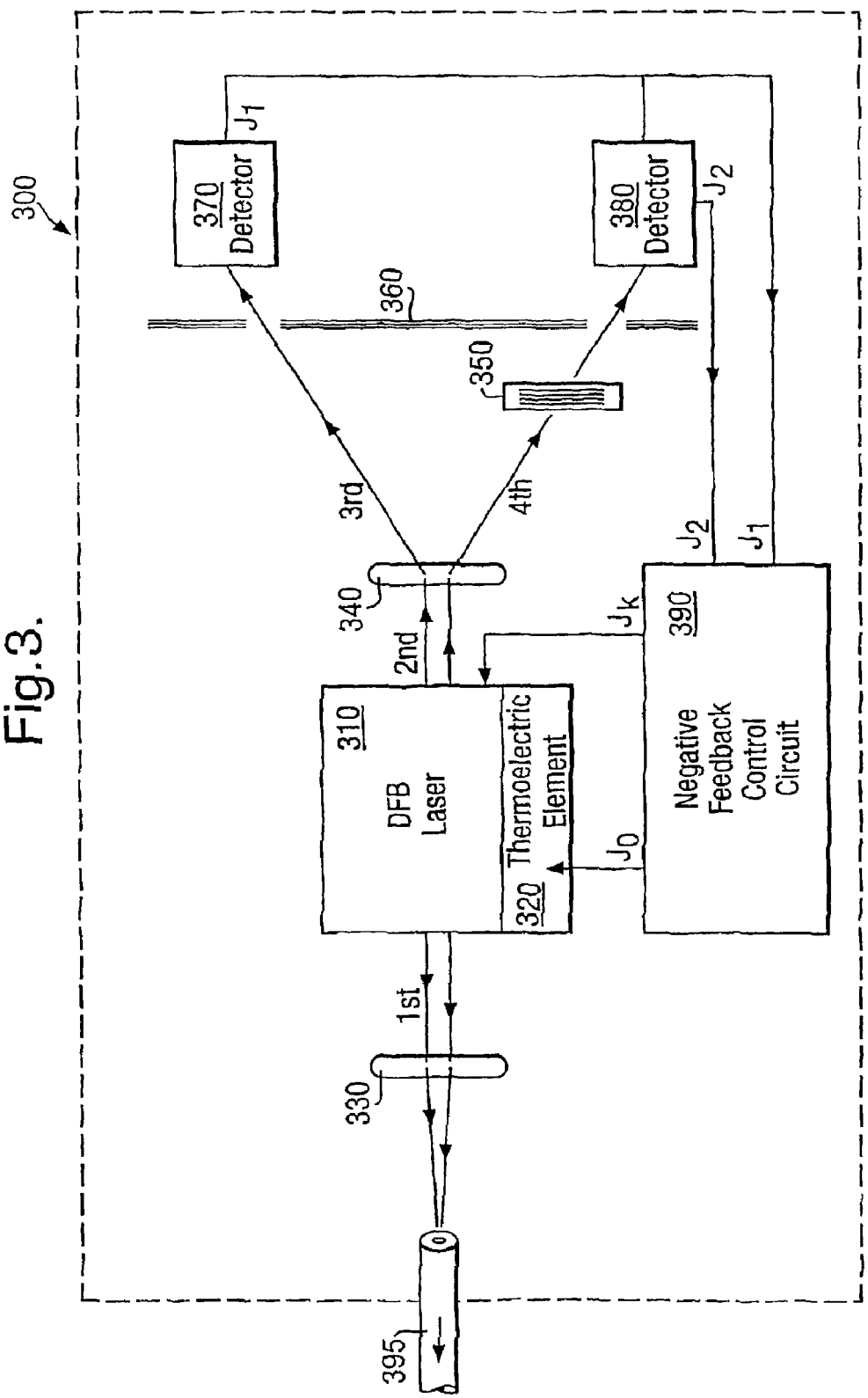
FIG. 3 is a schematic diagram of principal optical components of a stabilised radiation source according to the invention.

Referring now to FIG. 3, there is shown a schematic diagram of principal optical components of a stabilised radiation source according to the invention; the source is indicated generally by 300 and is housed within a single package. The source includes a distributed feedback (DFB) laser 310 having associated therewith a thermoelectric element 320. The element 320 is in thermal communication with the laser 310 and is operable to heat or cool the laser 310 to modify the wavelength of optical radiation output therefrom.

The source 300 further comprises and front facet lens 330 of similar design to the lens 30, a back facet lens 340 similar in design to the lens 40, an optical filter etalon 350, a stencil mask 360, first and second mutually matched optical radiation detectors 370, 380 similar in design to the detectors 70, 80 respectively, and a negative feedback control circuit 390. The source 300 is operable to output radiation into an optical fibre 395 mounted to receive radiation output from the laser 310 through the lens 330 to the fibre 395.

Interconnection of component parts of the source 300 will now be described. The front lens 330 is located along a first optical path from a first radiation output end of the laser 310 to an entrance aperture of the fibre 395. The back lens 340 is located in a second optical radiation path from a second output end of the laser 310. The back lens 340 is operable to couple radiation propagating along the second path into third and fourth radiation paths. The third radiation path extends from the back lens 340 through a first aperture of the mask 360 to the first detector 370. The fourth radiation path extends from the back lens 340 through the filter etalon 350 and through a second aperture of the mask 360 to the second detector 380. The third and fourth paths are not coincident but subtend and angle with respect to one another. Electrical output signals $J_1, J_2$ from the detectors 370, 380 respectively are connected to the control circuit 390. Electrical outputs $J_0, J_K$ from the circuit 390 are connected to the thermoelectric element 320 and to the laser 310 respectively.

Operation of the source 300 will now be described in overview with reference to FIG. 3. The laser 310 outputs radiation from its first end which propagates along the first path to the front lens 330 which focuses the radiation into an entrance aperture of the fibre 395. The laser 310 also outputs radiation from its second end which propagates along the second path to the back lens 340 which couples the radiation into radiation components which propagate along the third and fourth paths. Radiation propagating along the third path passes through the first aperture to the first detector 370 which receives the radiation and generates the corresponding electrical signal $J_1$. Radiation propagating along the fourth path from the back lens 340 passes through the etalon filter 350 whereat it is filtered and onwards through the second aperture to the second detector 380. The second detector 380 receives the radiation and generates the corresponding electrical signal $J_2$. The signals $J_1, J_2$ pass to the control circuit 390 which monitors the signals $J_1, J_2$ and generates the corresponding signals $J_0, J_K$ for controlling the laser 310. The circuit 390 operates to adjust power applied to the thermoelectric element 320 so that the signals $J_1, J_2$ are of nominally similar magnitude; when the signals $J_1, J_2$ are similar, the laser 310 is deemed to be operating at its correct stabilised frequency. Moreover, the circuit 390 operates to adjust lasing current applied to the laser 310 so that the signal $J_1$ is similar to a reference level signal applied to the circuit 390; when the signal $J_1$ is similar in magnitude to the reference signal, the laser 310 is deemed to be operating at its correct stabilised power; as a consequence of the third path not including an optical filter, the signal $J_1$ is substantially unaffected by tuning of the laser 310.

Figure 4:
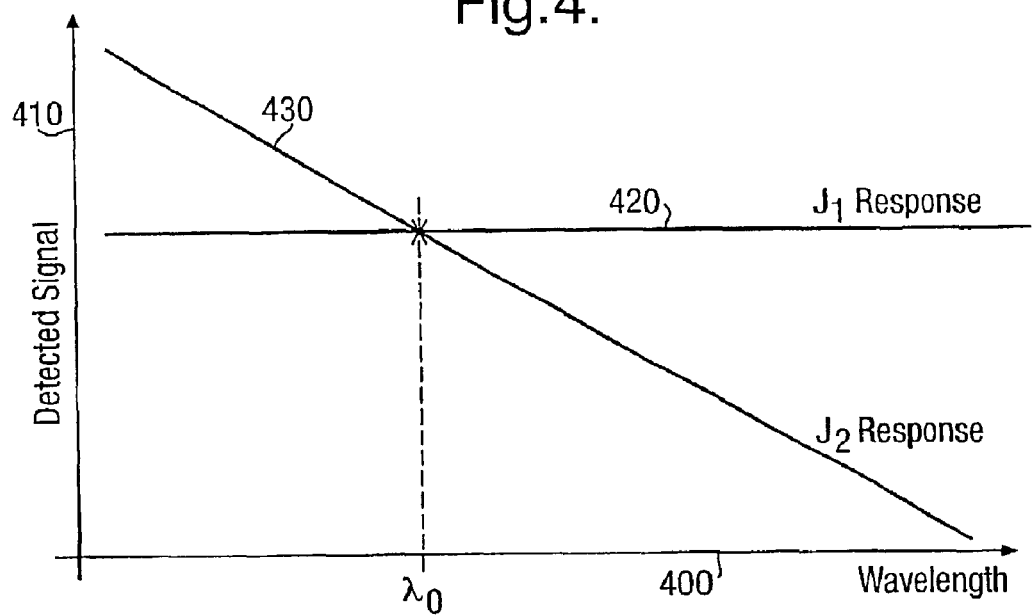
FIG. 4 is a graph illustrating transmission characteristics of optical paths to detectors included within the source illustrated in FIG. 3.

Referring now to FIG. 4, there is shown a graph illustrating transmission characteristics of the third and fourth optical paths as represented in the signals $J_1, J_2$. The graph includes a horizontal wavelength axis 400 and a vertical detected signal axis 410. The etalon filter 350 comprises an optical resonant cavity (etalon) and associated optical gratings to provide a radiation transmission characteristic along the fourth path which diminishes in relation to increasing wavelength over a wavelength range of interest; such a characteristic is represented by a curve 430 in FIG. 4. As a consequence of their being no filters included in the third path, the detector 370 provides a response which is substantially constant with wavelength as represented by a curve 420. At a wavelength $\lambda_0$, the signals $J_1, J_2$ from the detectors 370, 380 respectively are similar; the control circuit 390 regulates power input to the thermoelectric element 320 to maintain the signals $J_1, J_2$ mutually similar thereby stabilising the laser 310 to the wavelength $\lambda_0$. The signal $J_1$ is a direct measure of output radiation power irrespective of tuning of the laser 310, thus power control by controlling lasing current applied to the laser 310 can be promptly implemented at initial start-up of the source 300.

It is seen from FIG. 4 that the curve 430 is not of Gaussian form, but of substantially linear form. Such a linear form assists the control circuit 390 to rapidly iterate to stabilise the laser 310. In contradistinction, the control circuit 90 of the prior art source 10 shown in FIG. 1 can experience difficulty stabilising the laser 20 if the laser 20 initially is detuned to wavelengths greater than $\lambda_2$ and less than $\lambda_1$; such difficulty arises because of the presence of local minima. Thus, characteristics represented in the curves 420, 430 assist the control circuit 390 to unambiguously iterate towards correctly stabilising the laser 310.

To one ordinarily skilled in the art, the notion of not including an optical filter in the third path of the source 300 would appear to be a retrograde development because symmetry within the source 300 is forfeited relative to the source 10. Moreover, the use of the etalon filter 350 providing a broad substantially linear response as represented in the curve 430 would appear as a loss of wavelength sensitivity compared with peaky Gaussian-responses as represented by the curves 220, 230 for the source 30. In practice, the inventors find a surprising result that using only the single filter 350 in the source 300 does not degrade its temporal and temperature stability relative to the prior art source 30.

Figure 5:
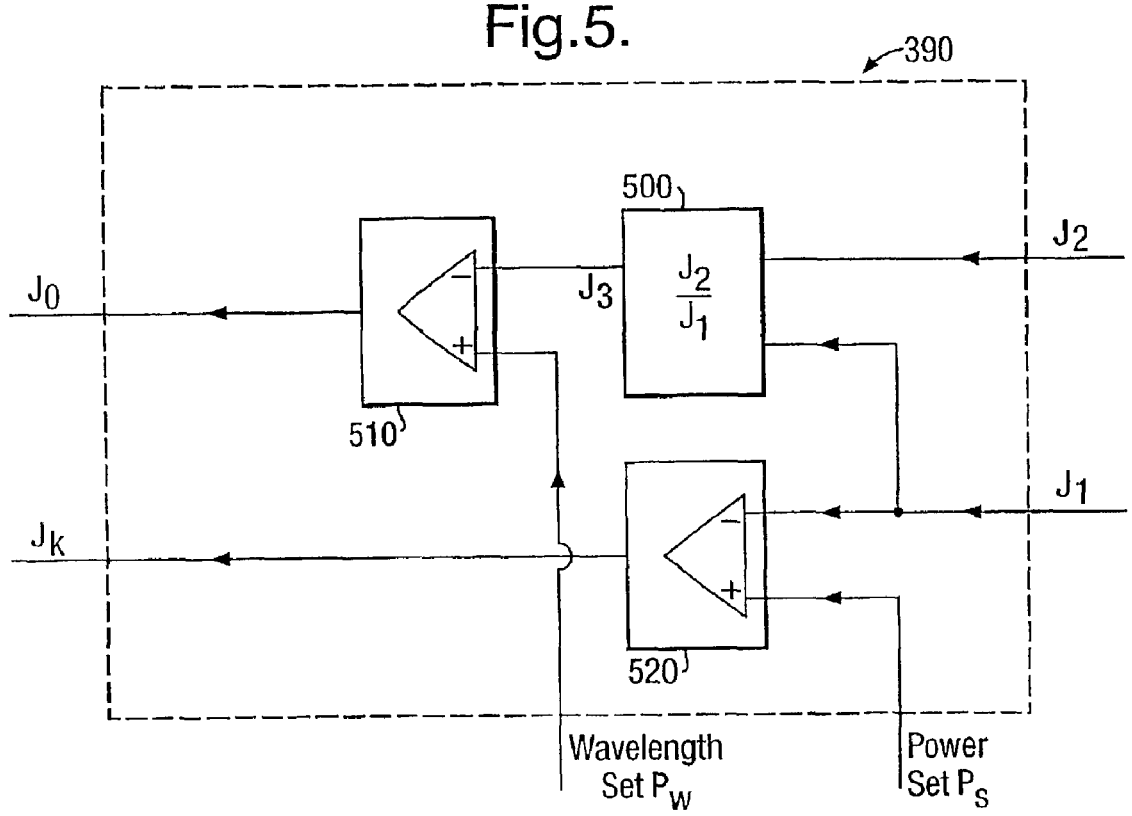
FIG. 5 is a schematic diagram of negative feedback electrical control loops associated with the source shown in FIG. 3.

For further elucidating the invention, the control circuit 390 of the source 300 will now be described in more detail with reference to FIG. 5. The control circuit 390 comprises a ratio calculator 500, a first amplifier 510 and a second amplifier 520. The circuit 390 includes signal $J_1, J_2$ inputs and also two additional inputs for a wavelength set reference signal $P_w$ and a power set reference signal $P_s$. The circuit 390 comprises two signal outputs $J_0$ and $J_K$ for driving the thermoelectric element 320 and the laser 310 respectively. The circuit 390 is implementable using analogue electronic components, where the amplifiers 510, 520 are operational amplifiers and the ratio calculator 500 is a specialist analogue device, for example manufactured by Analog Devices Inc. Alternatively, the circuit 390 is implementable digitally in which case the ratio calculator 500 and the amplifiers 510, 520 are executed in software; the circuit 390 can, for example, be a field programmable gate array (FPGA) or a microprocessor with associated software and analogue-digital input-output interfacing components.

Interconnection within the circuit 390 will be described where it is implemented using analogue components. The input signals $J_1$, $J_2$ are connected to first and second inputs of the calculator 500 respectively. Moreover, the input signal $J_1$ is connected to an inverting input of the amplifier 520. The power set reference signal $P_s$ is connected to a non-inverting input of the amplifier 520. An output from the amplifier 520 is connected to provide the $J_K$ signal output for controlling lasing current of the laser 310. The calculator 500 includes an output $J_3$ at which a signal corresponding to the ratio $J_2/J_1$ is provided. The signal $J_3$ is connected to an inverting input of the amplifier 510. Moreover, the wavelength set reference signal $P_w$ is connected to a non-inverting input of the amplifier 510. An output from the amplifier 510 is connected to the $J_1$ signal output for driving the thermoelectric element 320.

In operation, the circuit 390 adjusts the $J_K$ signal until the $J_1$ signal matches the power set $P_s$ signal; such adjustment stabilises radiation output power from the laser 310. Moreover, the circuit 390 adjusts the drive signal $J_0$ to the thermoelectric element 320 so that the ratio $J_2/J_1$ matches the wavelength set $P_w$ signal; if the $P_w$ signal is set to value of unity, the laser 310 is stabilised to a wavelength $\lambda_0$ as illustrated in FIG. 4.

Figure 6:
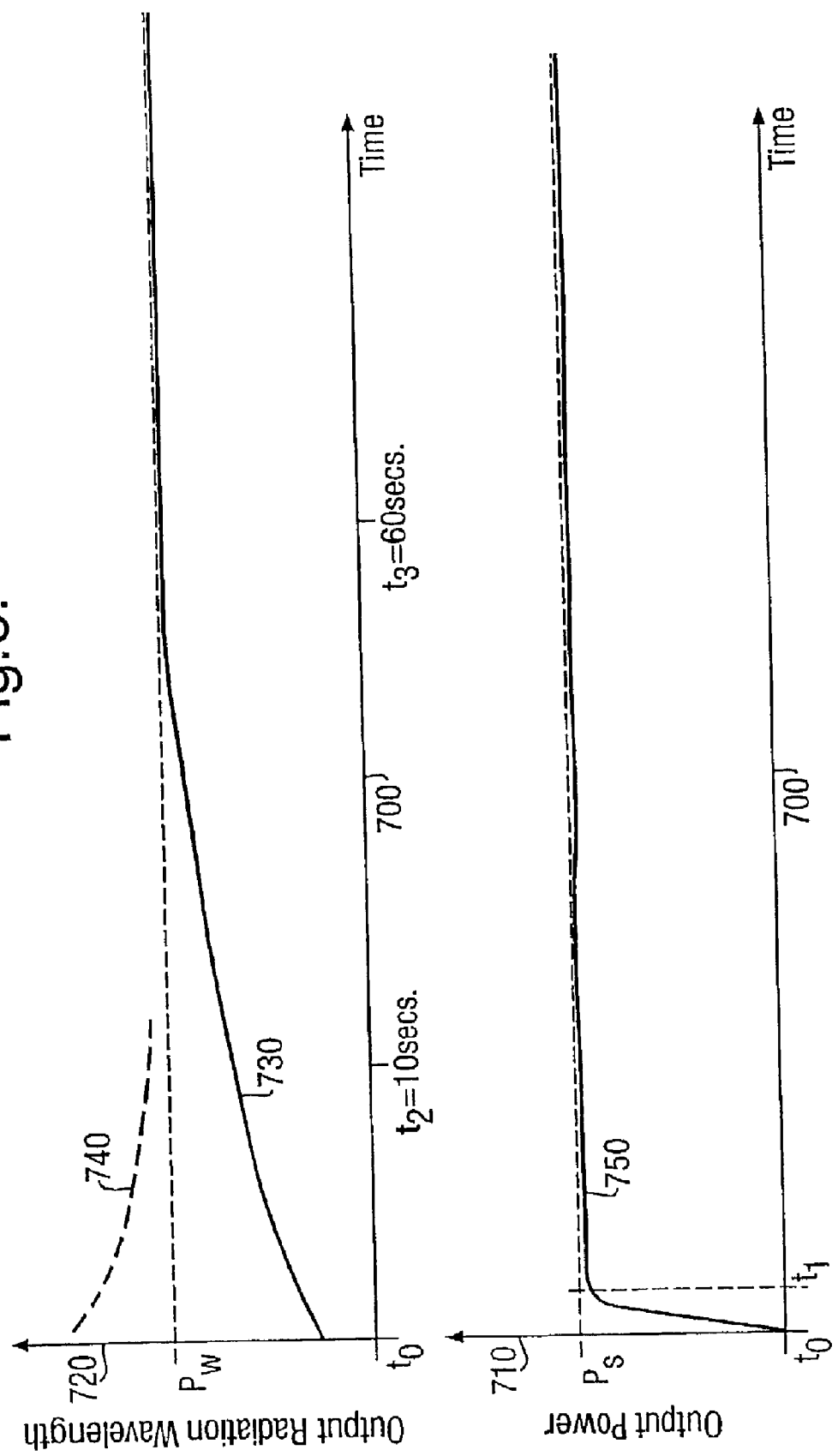
FIG. 6 is a graph of initial start-up characteristic of the source shown in FIG. 3.

In order to further describe operation of the source 300, reference is made to FIG. 6. FIG. 6 is a graph of initial start-up characteristic of the source 300. Power is applied at a time $t_0$. Lasing action within the laser 310 starts promptly upon current being applied thereto; because the first detector 370 and the circuit 390 provide a prompt response, power output of radiation emitted from the laser 310 is power stabilised by a time $t_1$ which is at most a few milliseconds after the time $t_0$. However, because thermal control via the thermoelectric element 320 is employed to control wavelength of the laser 310, a much longer time constant is associated with wavelength control of the source 300; thermal time constants associated with the element 320 and the laser 310 principally determine the time constant for wavelength stabilisation. In practice, stabilisation takes around 60 seconds at most but depends on how much the laser 310 is detuned when power is initially applied at the time $t_0$.

In FIG. 6, elapsed time is represented along horizontal axes 700. Laser radiation output power is represented along a vertical axis 710. Moreover, laser output radiation wavelength is represented along a vertical axis 720. A curve 750 illustrates power output settling characteristics of the source 300. Moreover, a curve 730 illustrates settling characteristic of the source 300 when its laser 310 is initially too high in frequency, and a curve 740 illustrates settling characteristics when the laser 310 is initially too low in frequency.

The source 300 provides the beneficial characteristics that its output power and output radiation wavelength can be adjusted independently using the reference signals $P_s$, $P_w$. Moreover, on account of using feedback control, ageing and thermal drift effects occurring within the laser 310 are compensated for by feedback loops in the source 300. Furthermore, by using matched detectors 370, 380, common mode drift effects therein do not affect wavelength stability of the source 300.

It is found in practice that the control circuit 390 is capable of regulating temperature of the laser 310 to a stability error of 0.01° C. In a modified version of the source 300, it is desirable to include an additional alarm circuit which is activated if the laser 310 deviates by more than 0.5° C. from its calibrated setting for producing output radiation of a specific wavelength; such an alarm can be used for detecting the onset of failure of the source 300 and allow the source 300 to be powered down before causing disruption.

It will be appreciated that modifications can be made to the source 300 without departing from the scope of the invention. For example, the signal $J_0$ can be a pulse width modulated (PWM) drive signal generated by the control circuit 390 for driving the thermoelectric element 320; such a PWM signal reduces power dissipation within the control circuit 390. Moreover, although the laser 310 is thermally controlled with regard to wavelength in the source 300, the source 30 can be modified so that the thermoelectric element 320 is replaced with a flexural element for modifying wavelength of the laser 310; use of such a flexural element potentially renders the source more responsive.

Although the source 300 only includes two detectors 370, 380, it is feasible for it to include more detectors to improve its reliability or accuracy.

The source 300 can be incorporated into communication systems for generating radiation for modulating with communication traffic and subsequently transmitting through optical fibre waveguides to points of reception.

What is claimed is:

1. A stabilized radiation source comprising:
a) radiation generating means for generating output radiation;
b) radiation coupling means for coupling a portion of the output radiation into first and second optical paths;
c) detecting means for detecting radiation transmitted through the first and second paths, and for generating first and second signals indicative of radiation power in the radiation transmitted through the first and second paths respectively;
d) controlling means for controlling the generating means in response to the signals for stabilizing a wavelength and a radiation power of the output radiation to pre-selected power and wavelength values;
e) the first path being operable to provide substantially unfiltered radiation to the detecting means;
f) the second path including a filter for providing wavelength dependent filtered radiation to the detecting means, the filter having a transmission versus wavelength characteristic that decreases substantially linearly with radiation wavelength over a range of wavelengths in which the source is operable; and
g) the controlling means being operable to control firstly the radiation power of the output radiation from the generating means so that a magnitude of the first signal is substantially equal to a first pre-selected magnitude for stabilizing said output radiation power to said pre-selected power value, and then operable to control the wavelength of the output radiation from the generating means so that a ratio of the second signal divided by the first signal is substantially equal in magnitude to a second pre-selected magnitude for stabilizing said output radiation wavelength to said pre-selected wavelength value.

2. The source according to claim 1, wherein the control means is operable to control the generating means so that the signals are substantially equal in magnitude.

3. The source according to claim 1, wherein the filter comprises an etalon filter.

4. The source according to claim 1, wherein the first path is devoid of wavelength dependent filtration components.

5. The source according to claim 1, wherein the controlling means is operable to modify a temperature of the generating means for controlling the wavelength of the output radiation.

6. The source according to claim 3, wherein the generating means includes a laser for generating the output radiation, and a thermoelectric element operable to change the temperature of the laser for modifying the wavelength of the output radiation, the element being drivable from the controlling means.

7. The source according to claim 1, wherein the generating means includes a laser for generating the output radiation, and a flexural element operable for modifying the wavelength of the laser, the flexural element being drivable from the controlling means.

8. The source according to claim 1, wherein the detecting means includes a plurality of radiation detectors for generating the signals, the detectors having mutually matched detection characteristics.

9. A method of stabilizing a power and a wavelength of output radiation from a source to pre-selected power and wavelength values, comprising the steps of:

a) powering a radiation generating means for generating the output radiation;

b) coupling a portion of the output radiation into first and second optical paths;

c) wavelength dependent filtering the radiation propagating along the second path, wherein the filtering has a transmission versus wavelength characteristic that decreases substantially linearly with radiation wavelength;

d) propagating the radiation substantially unfiltered along the first path;

e) generating first and second signals corresponding to the radiation transmitted through the first and second paths respectively;

f) controlling the radiation power of the output radiation so that a magnitude of the first signal is substantially equal to a first pre-selected magnitude for stabilizing said output radiation power to said pre-selected power value; and g) controlling the wavelength of the output radiation so that a ratio of the second signal divided by the first signal is substantially equal in magnitude to a second pre-selected magnitude for stabilizing said output radiation wavelength to said pre-selected wavelength value.

10. The method according to claim 9, and comprising the step of controlling the generating means so that the signals are substantially equal in magnitude.

* * * * *

UNITED STATES PATENT AND TRADEMARK OFFICE
CERTIFICATE OF CORRECTION

PATENT NO. : 6,933,485 B2  Page 1 of 1
APPLICATION NO. : 10/239616
DATED : August 23, 2005
INVENTOR(S) : Livermore et al.

It is certified that error appears in the above-identified patent and that said Letters Patent is hereby corrected as shown below:

On the Title Page, in Field (73), under "Assignee", in Column 1, Line 1, delete "Lik" and insert -- UK --, therefor.

On the Title Page, under "Notice", in Column 1, Line 3, delete "218" and insert -- 166 --, therefor.

Signed and Sealed this

Thirty-first Day of March, 2009

JOHN DOLL
*Acting Director of the United States Patent and Trademark Office*